United States Patent
Hayashi (10) Patent No.: US 9,612,604 B2
(45) Date of Patent: Apr. 4, 2017

(54) DC-DC CONVERTER AND TELEVISION RECEIVER THEREWITH

(71) Applicant: Rohm Co., Ltd., Kyoto (JP)

(72) Inventor: Hidekazu Hayashi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/754,790

(22) Filed: Jun. 30, 2015

(65) Prior Publication Data

US 2016/0011610 A1 Jan. 14, 2016

(30) Foreign Application Priority Data

Jul. 11, 2014 (JP) .................................. 2014-143255

(51) Int. Cl.
| | | |
|---|---|---|
| G09G 3/20 | (2006.01) | |
| G05F 1/56 | (2006.01) | |
| H04N 5/63 | (2006.01) | |
| G09G 3/36 | (2006.01) | |
| H02M 3/15 | (2006.01) | |
| H03K 17/16 | (2006.01) | |
| H02M 3/158 | (2006.01) | |
| H04N 5/44 | (2011.01) | |

(52) U.S. Cl.
CPC ............. *G05F 1/56* (2013.01); *G09G 3/3696* (2013.01); *H02M 3/1588* (2013.01); *H03K 17/162* (2013.01); *H04N 5/44* (2013.01); *H04N 5/63* (2013.01); *G09G 3/20* (2013.01); *G09G 2330/00* (2013.01); *H03K 2217/0063* (2013.01); *H03K 2217/0072* (2013.01); *H03K 2217/0081* (2013.01); *Y02B 70/1466* (2013.01)

(58) Field of Classification Search
CPC .................... H04N 5/63; G05F 1/56; H03K 2217/0054–2217/0081
See application file for complete search history.

(56) References Cited

U.S. PATENT DOCUMENTS

| | | | | |
|---|---|---|---|---|
| 8,558,586 | B1 * | 10/2013 | Martin | ................ G11C 7/1057 327/108 |
| 2009/0108908 | A1 * | 4/2009 | Yamadaya | .............. H02M 1/08 327/390 |

FOREIGN PATENT DOCUMENTS

| | | |
|---|---|---|
| JP | 2010-200554 | 9/2010 |
| JP | 2011-078212 | 4/2011 |

* cited by examiner

*Primary Examiner* — Michael Teitelbaum
(74) *Attorney, Agent, or Firm* — Fish & Richardson P.C.

(57) ABSTRACT

In a DC-DC converter that can be operated in an asynchronous manner with a rectification diode connected to an external terminal, a conducting path through a transistor that is turned on and off according to a clock signal is provided between a bootstrap circuit, which is composed of a bootstrap diode and a bootstrap capacitor, and a ground terminal.

18 Claims, 7 Drawing Sheets

DC-DC CONVERTER AND TELEVISION RECEIVER THEREWITH

This application is based on Japanese Patent Application No. 2014-143255 filed on Jul. 11, 2014, the contents of which are hereby incorporated by reference.

BACKGROUND OF THE INVENTION

1. Field of the Invention

The present invention relates to a DC-DC converter, and more particularly relates to a DC-DC converter that is provided with a bootstrap circuit and that allows selection between synchronous rectification and asynchronous rectification (though the latter is also called diode rectification, in the present specification, "asynchronous rectification" is stacked to).

2. Description of Related Art

In a DC-DC converter that uses an N-channel MOSFET (metal oxide semiconductor field-effect transistor) as a high-side switching device, to turn on the high-side switching device sufficiently, a bootstrap circuit is adopted for stepping up the driving voltage applied to the device's gate to or over the input voltage applied to the device's drain. Such a bootstrap circuit is employed both in so-called synchronous rectification, which uses an N-channel MOSFET as a low-side switching device, and in so-called asynchronous rectification, which does not use an N-channel MOSFET but instead uses a rectification diode. Incidentally, when a P-channel MOSFET is used as a high-side switching device, no bootstrap circuit is required. In that case, however, due to transistor characteristics, the P-channel MOSFET needs to be given a size twice to three times that of an N-channel MOSFET, which is inconvenient. For this reason, not a small number of DC-DC converters employ a bootstrap circuit that has an N-channel MOSFET as a high-side switching device.

Irrespective of whether they are of a step-up type or a step-down type, DC-DC converters can be classified into, for example, those adopting synchronous rectification and those adopting asynchronous rectification. Synchronous rectification involves turning on and off a high-side switching device and a low-side switching device complementarily. As a low-side switching device, an N-channel MOSFET of the same conductivity type as the high-side switching device is used, and asynchronous rectification does not use a low-side switching device but instead adopts, for example, a Schottky barrier diode. Usually, a high-side switching device and a low-side switching device are integrated into one semiconductor chip. Accordingly, synchronous rectification suffers from increased power consumption. On the other hand, in asynchronous rectification, the Schottky barrier diode is provided as a component externally fitted to an IC, and thus does not effect the power consumption of the semiconductor chip. The forward voltage of a Schottky barrier diode is in the range of 0.2 V to 0.5 V, and is thus lower than the forward voltage, 0.7 V, of an ordinary PJ-junction diode. This is beneficial from the perspective of reducing the power consumption of the DC-DC converter as a whole.

According to Japanese Patent Application Publication No. 2010-200554 (hereinafter Patent Document 1), a DC-DC converter is provided which, even when an output voltage is high, can complete initial charging of a bootstrap capacitor and can be started up quickly. Patent Document 1 will be further discussed later.

According to Japanese Patent Application Publication No. 2011-78212 (hereinafter Patent Document 2), in a DC-DC converter, switching between synchronous and asynchronous operation is performed with optimal timing in accordance with the state of a load.

Figure 5:
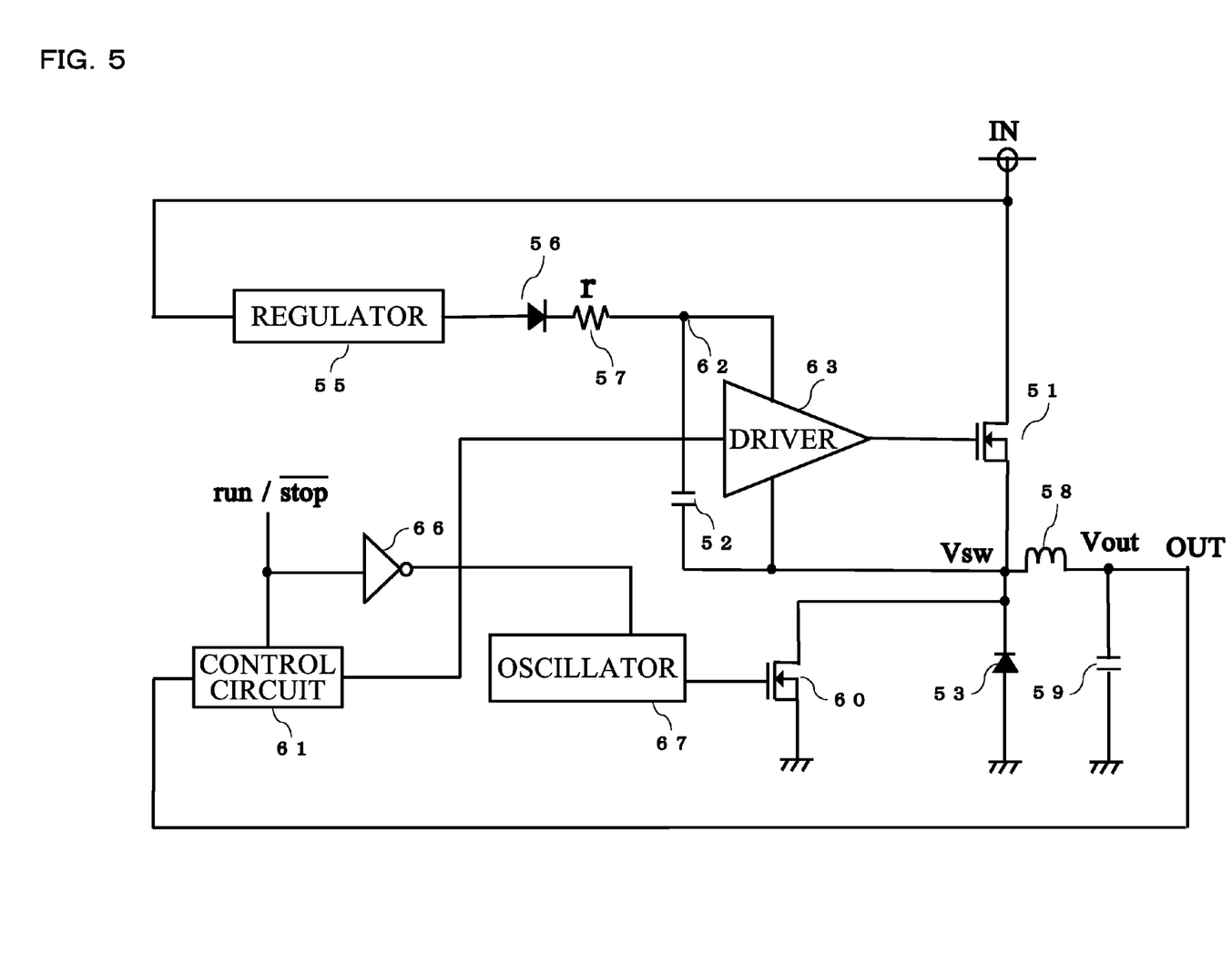
FIG. 5 is a diagram showing a common configuration of a conventional step-down DC-DC converter provided with a bootstrap circuit.

FIG. 5 is a block diagram of a conventional example of a step-down DC-DC converter disclosed in Patent Document 1. This conventional example includes a bootstrap circuit for driving a high-side switching device 51, a switch 60 connected in series with the high-side switching device 51, a reflux diode 53 connected in parallel with the switch 60, a driver 63 for turning on and off the high-side switching device 51, a control circuit 61 for controlling the driver 63, and an oscillator 67 for turning on and off the switch 60.

The oscillator 67 is fed with, via an inverter 66, a run/stop-bar signal, which is an input to the control circuit 61; thus, when the run/stop-bar signal is at high level, the oscillator 67 stops (its output being at low level), and when the run/stop-bar signal is at low level, the oscillator 67 operates (outputting pulses). When the output signal of the oscillator 67 is at high level, the switch 60 is on, so that a charging current passes through a bootstrap capacitor 52 across a route from a regulator 55 to a bootstrap diode 56, to a resistor 57, to the bootstrap capacitor 52, and to the switch 60. When the output signal of the oscillator 67 is at low level, the switch 60 is off, so that the current passing via an inductor L58 decreases as it passes through a body diode (unillustrated) of the high-side switching device 51 to the input IN, until eventually the low potential-side terminal voltage Vsw of the high-side switching device 51 falls to low level.

When the output signal of the oscillator 67 turns back to high level, the switch 60 turns back on, and the bootstrap capacitor 52 is charged. As a result of this sequence of operations being repeated, even when the output voltage Vout does not fall sufficiently, a rise in the terminal voltage Vsw is suppressed so that the bootstrap capacitor 52 can be charged sufficiently.

However, the configuration of the DC-DC converter of Patent Document 1 shown in FIG. 5 requires an extra oscillator 67. This leads to a comparatively increased semiconductor chip area. Moreover, Patent Document 1 is aimed at, when starting up a DC-DC converter, temporarily charging a bootstrap capacitor to achieve reliable and quick start-up, and suggests nothing about charging of a bootstrap capacitor in a steady state of the DC-DC converter. In addition, while suggesting application to both synchronous and asynchronous rectification, Patent Document 1 suggests nothing about switching between synchronous and asynchronous rectification.

According to Patent Document 2, switching between synchronous and asynchronous rectification is possible. The switching, however, requires the provision of an off-state period detector for detecting the absolute value of the off-state period of the high-side switching device, and a control switcher for switching between synchronous and asynchronous rectification based on the absolute value of the off-state period, inconveniently resulting in a somewhat complicated circuit configuration. Furthermore, since the absolute value of the off-state period of the high-side switching device is detected, attempting to cope with varying operating frequencies further complicates the design of the off-state period detector and the control switcher, leading to an even larger circuit scale. In addition, when switched to asynchronous rectification, it is inevitable to use a body diode incorporated on the low-side switching device side and having a comparatively high forward voltage, making reduction in power consumption impossible.

SUMMARY OF THE INVENTION

Against the background discussed above, an object of the present invention is to provide a DC-DC converter that allows easy selection between synchronous and asynchronous rectification with a simple configuration while suppressing increases in device size and cost and that can be started up reliably and quickly; another object of the present invention is to provide a television receiver employing such a DC-DC converter.

According to one aspect of the present invention, a DC-DC converter for converting a DC input voltage into a desired DC output voltage to output the DC output voltage includes: a high-side switching device connected to the DC input voltage and operable in synchronism with a clock signal; a first driver fed with a first drive signal stepped-up to or over the DC input voltage so as to be operable to drive the high-side switching device; a bootstrap circuit having a bootstrap capacitor so as to be operable to generate the first drive signal; a low-side switching device connected in series with the high-side switching device between the DC input voltage and a ground voltage, the low-side switching device being operable to be on when the high-side switching device is off; a second driver operable to drive the low-side switching device, the second driver being fed with a second drive signal which is complementary with the first drive signal; and a drive logic circuit operable to drive the first and second drivers. Here, the drive logic circuit includes a selector operable to select and feed to the second driver either the second drive signal or a third drive signal equivalent to the clock signal.

According to another aspect of the present invention, in the above-described DC-DC converter, the clock signal has a first pulse width w1 and a second pulse width w2 forming a rectangular waveform, and the low-side switching device is turned on with an on-duty ratio Do (=w1/(w1+w2)) in the range of 0.02 to 0.30.

These and other features, elements, steps, benefits, and characteristics of the present invention will become clear through the following detailed description of the best modes of carrying out the invention with reference to the accompanying drawings.

DETAILED DESCRIPTION OF PREFERRED EMBODIMENTS

Figure 1:
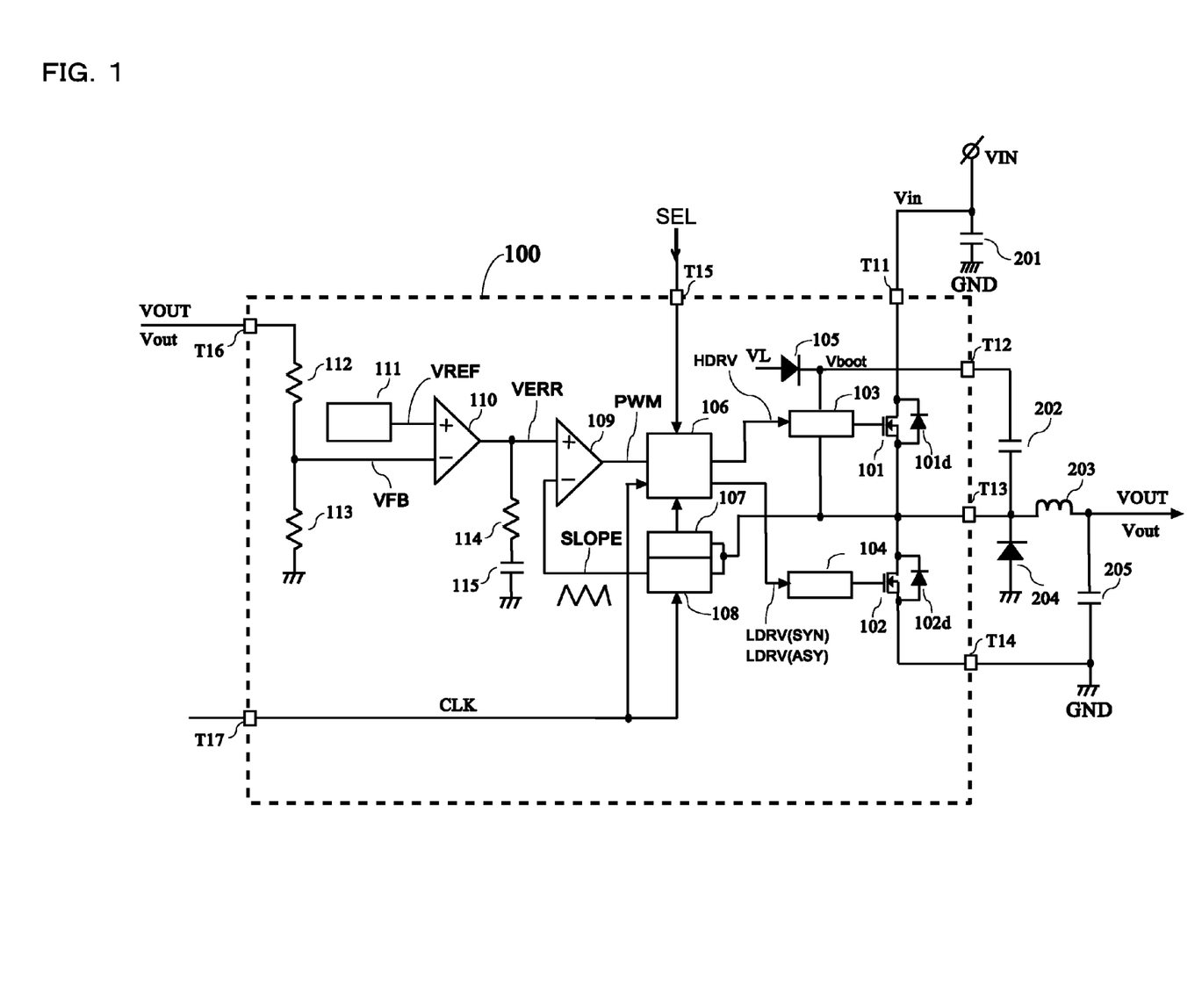
FIG. 1 is a diagram showing one configuration example of a DC-DC converter embodying the present invention.

FIG. 1 is a circuit diagram showing a DC-DC converter embodying the present invention. The DC-DC converter of this configuration example includes a semiconductor integrated circuit device 100 and, as discrete components externally connected to it, a capacitor 201, a bootstrap capacitor 202, an inductor 203, a rectification diode 204, and a smoothing capacitor 205.

The circuit configuration shown in FIG. 1 is applicable to both synchronous and asynchronous rectification, and the rectification diode 204 is unnecessary in synchronous rectification. In a case where frequent switching between synchronous and asynchronous rectification takes place, it is preferable that a space for mounting the rectification diode 204 in be reserved beforehand, for example, on a printed circuit board.

The semiconductor integrated circuit device 100 is a power supply IC that has integrated into it a transistor 101, a transistor 102, a first driver 103, a second driver 104, a bootstrap diode 105, a drive logic circuit 106, an overcurrent protection circuit 107, a slope voltage generation circuit 108, a PWM (pulse-width modulation) comparator 109, an error amplifier 110, a reference voltage generation circuit 111, voltage division resistors 112 and 113, a phase compensation resistor 114, and a phase compensation capacitor 115. The semiconductor integrated circuit device 100 also has external terminals T11 to T17 as a means for establishing electrical connection with the outside of the device.

Outside the semiconductor integrated circuit device 100, an external terminal T11 (power terminal) is connected to an input voltage terminal VIN and to a first terminal of the capacitor 201. A second terminal of the capacitor 201 is connected to a ground terminal GND (external terminal T14). The capacitor 201 serves to suppress ripple and noise components contained in a DC (direct-current) input voltage Vin applied to the input voltage terminal VIN. An external terminal T12 (boot terminal) is connected to a cathode of the bootstrap diode 105 and to a first terminal of the bootstrap capacitor 202. An external terminal T13 (switch terminal) is connected to a first terminal of the inductor 203, to a second terminal of the bootstrap capacitor 202, and to a cathode of the rectification diode 204. A second terminal of the inductor 203 is, as an output terminal VOUT, connected to a first terminal of the smoothing capacitor 205 and to an external terminal T16. An anode of the rectification diode 204 is connected to a ground potential (external terminal T14). An external terminal T15 (selection terminal) is an input terminal to which a selection signal is fed for selecting either synchronous or asynchronous rectification; that is, the external terminal T15 is fed with a selection signal SEL for selecting either synchronous or asynchronous rectification. The external terminal T16 (feedback terminal) is connected to one end of the voltage division resistor 112, and serves to feed a DC output voltage Vout back to the error amplifier 110. An external terminal T17 (clock terminal) is a terminal via which a clock signal CLK is received from outside the semiconductor integrated circuit device 100, and is unnecessary in a case where a clock signal CLK is generated inside the semiconductor integrated circuit device 100.

The transistor 101 is a high-side switching device to which the external terminal T11, i.e., the DC input voltage Vin, is connected. The high-side switching device is arranged on the high-potential side, and serves to feed electric current to the inductor 203 by repeatedly turning on and off intermittently. To a drain of the transistor 101, the DC input voltage Vin is connected. A source of the high-side transistor 101 is connected to the external terminal T13. A gate of the transistor 101 is connected to an output terminal of the first driver 103. To the transistor 101, a body diode 101d is virtually connected. The body diode 101d is a so-called parasitic diode which is formed parasitically when the transistor 101 is fabricated in the semiconductor integrated circuit device 100. A cathode of the body diode 101d is connected to the drain side, i.e., the external terminal T11 side, of the transistor 101. An anode of the body diode 101d is connected to the source side, i.e., the external terminal T13 side, of the transistor 101.

The transistor 102 is arranged on the external terminal T14 side, i.e., the ground terminal GND side, which is the low potential side. When synchronous rectification is selected, the transistor 102 serves to feed electric current to the inductor 203 by repeatedly turning on and off complementarily with the transistor 101. That is, the transistor 102 serves to achieve synchronous rectification in the DC-DC converter. In the present specification, "complementarily" denotes that the transistor 102 turns on and off in quite the opposite way to the transistor 101, specifically, for example, such that when the transistor 101 is on the transistor 102 is off and when the transistor 101 is off the transistor 102 is on. In this type of DC-DC converter, however, if the two transistors turn on simultaneously, a through current passes, which may degrade or destroy the transistors; to prevent that, it is common to provide a so-called dead time during which the two transistors are off simultaneously. In the present specification, "complementarily" should be understood to allow for such a dead time. In asynchronous rectification, the transistors 101 and 102 do not need to be operated complementarily. As one of the distinctive features of the present invention, however, during a period which corresponds to a part of the period in which the transistor 101 is off, the transistor 102 is turned on so that the bootstrap capacitor 202 is charged. The transistor 102 is switched according to a gate signal fed to it from the second driver 104. A drain of the transistor 102 is connected to the external terminal T13. The signal fed from the second driver 104 to the gate of the transistor 102 is substantially equivalent to either a second drive signal LDRV(SYN) or a third drive signal LDRV(ASY). The second drive signal LDRV(SYN) and the third drive signal LDRV(ASY) will be described later along with a first drive signal HDRV. A source of the transistor 102 is connected to the external terminal T14, i.e., the ground terminal GND. A gate of the transistor 102 is connected to an output terminal of the second driver 104. To the transistor 102, a body diode 102d is virtually connected. The body diode 102d is a so-called parasitic diode which is formed parasitically when the transistor 102 is fabricated in the semiconductor integrated circuit device 100. A cathode of the body diode 102d is connected to the drain side, i.e., the external terminal T13 side, of the transistor 102. An anode of the body diode 102d is connected to the source side, i.e., the external terminal T14 side and hence the ground terminal GND side, of the transistor 102.

A first power terminal (high-potential terminal) of the first driver 103 is connected to the external terminal T12. A second power terminal (low-potential terminal) of the first driver 103 is connected to the external terminal T13. An input terminal of the first driver 103 is connected to the drive logic circuit 106. As mentioned previously, the output terminal of the first driver 103 is connected to the gate of the transistor 101.

An input terminal of the second driver 104 is connected to the drive logic circuit 106. As mentioned previously, the output terminal of the second driver 104 is connected to the gate of the transistor 102.

The drive logic circuit 106 turns on and off the first and second drivers 103 and 104 based on a pulse width modulation signal PWM fed from the PWM comparator 109, the clock signal CLK, and the selection signal SEL. The circuit configuration and operation of the drive logic circuit 106 will be described later.

The PWM comparator 109 generates the pulse width modulation signal PWM by comparing an error voltage VERR output from the error amplifier 110 with a slope (triangular wave) voltage SLOPE output from the slope voltage generation circuit 108.

The error amplifier 110 generates the error voltage VERR by amplifying the difference between a division voltage of the DC output voltage Vout as extracted from the node at which the voltage division resistors 112 and 113 are connected together and a reference voltage VREF output from the reference voltage generation circuit 111.

On the output side of the error amplifier 110, i.e., on the input side of the PWM comparator, are connected the phase compensation resistor 114 and the phase compensation capacitor 115. It is well known to use such phase compensation components in a DC-DC converter in order to increase a phase margin, i.e., a difference with respect to a phase delay of 180 degrees, in the DC-DC converter. Consider a case where, when the loop gain of a DC-DC converter equals 0 db (a gain of 1), the phase is, for example, 120 degrees. Then, the phase margin is given by 180 degrees−120 degrees=60 degrees. A phase margin of, for example, 45 degrees or more is considered to be sufficient. The loop gain difference for a gain of 0 db with a phase delay of 180 degrees is referred to as "gain margin". For example, when the loop gain equals −20 db with a phase delay of 180 degrees, the gain margin equals 20 db.

The semiconductor integrated circuit device 100 includes the slope voltage generation circuit 108, the PWM comparator 109, the error amplifier 110, the reference voltage generation circuit 111, and the voltage division resistors 112 and 113, and these circuits together constitute a negative feedback circuit. This negative feedback circuit achieves such control that, when the DC output voltage Vout becomes higher or lower than a predetermined value for some reason, it is lowered or raised back to the predetermined level.

The overcurrent protection circuit 107 serves to shut down the operation of the transistor 101 when an overcurrent passes through the semiconductor integrated circuit device 100, more specifically through the transistor 101. The electric current passing through the transistor 101 can be grasped by detecting the voltage appearing at the external terminal T13. The on-state resistance of the transistor 101 can be grasped beforehand. For example, consider a case where the on-state resistance Ron is about 0.2Ω and an overcurrent of 5 A (ampere) passes through the transistor 101. In this case, a voltage drop of 0.2Ω×5 A=1 V occurs across the drain-source channel of the transistor 101. That is, a voltage drop of 1 V occurs between the external terminals T12 and T13. Such a voltage drop can be detected by a comparator so that, when an overcurrent of 5 A or more passes through the transistor 101, the overcurrent protection circuit 107 recognizes it and shuts down the operation of the transistor 101 via the drive logic circuit 106 and the first driver 103.

Next, the basic circuit operation of the DC-DC converter configured as described above will be described.

First, operation performed when synchronous rectification is selected will be described. Whether synchronous or asynchronous rectification is selected depends on the level of the selection signal fed to the external terminal T15 in FIG. 1. For example, when the external terminal T15 is at low level, synchronous rectification is selected. In synchronous rectification, the first and second drivers 103 and 104 output control signals by turning on and off the transistors 101 and 102 complementarily.

When the transistor 101 is off and the transistor 102 is on, a charge current that charges the bootstrap capacitor 202 passes from a node to which an input supply voltage VL is applied (an input supply voltage VL application node) to the ground terminal GND (external terminal T14) via the bootstrap diode 105, the bootstrap capacitor 202, and the transistor 102. As a result, the potential at one end of the bootstrap capacitor 202, i.e., the potential V12 at the external terminal T12, rises to (Vl−Vd) (where Vl is the voltage value of the input supply voltage VL, and Vd is the forward voltage across the bootstrap diode 105), becoming higher than the potential of an input supply voltage V11 applied to the external terminal T11. Thus, the driving voltage output from the first driver 103 is raised to be more than high enough to drive the transistor 101.

Next, when the second driver 104 turns the transistor 102 from on to off, a boot voltage Vboot of the first driver 103 that has been previously raised turns on the transistor 101. At this time, the first driver 103 is driven with a boot voltage Vboot (=Vin+Vl−Vd) which is the sum of the charge voltage (Vl−Vd) of the bootstrap capacitor 202 and the input voltage VIN, and controls the switching of the transistor 101.

Through repetition of the above-described operation, an unillustrated load is coupled to the output terminal VOUT, and the load is supplied with the DC output voltage Vout smoothed by the smoothing capacitor 205.

Next, operation performed when asynchronous rectification is selected will be described. How asynchronous rectification is selected is similar to how synchronous rectification is selected; specifically, which is selected depends on the level fed to the external terminal T15. For example, when the external terminal T15 is at high level, asynchronous rectification is selected. In asynchronous rectification, the second driver 104 and the transistor 102 are released from complementary operation with the first driver 103 and the transistor 101 respectively; the transistor 102 as a low-side switching device repeatedly turns on and off according to a third drive signal LDRV(ASY) which is substantially equivalent to the clock signal CLK.

When asynchronous rectification is selected at the external terminal T15, there are three operation periods, namely operation period 1, in which the transistor 101 is on and the transistor 102 is off; operation period 2, in which the transistor 102 is on and the transistor 101 is off; and operation period 3, in which the transistors 101 and 102 are off simultaneously. Operation period 3 is generally called dead time. These three operation periods occur also in synchronous rectification.

Inherently, asynchronous rectification does not require the transistor 102 and instead adopts the rectification diode 204. During operation period 2, i.e., when the transistor 101 is off, an electric current is fed to the inductor 203 via the rectification diode 204.

As mentioned above, asynchronous rectification inherently does not require the transistor 102 and instead adopts the rectification diode 204. Thus, theoretically it should be meaningless to discuss the operation state of the transistor 102 during operation period 2, i.e., when the transistor 101 is off. Nevertheless, in the present invention, as one of its distinctive features, the transistor 102 is turned on, though for a short period, together with the rectification diode 204. At this time, the transistor 102 forms a charging path of a bootstrap circuit, and helps reliably turn on and off the transistor 101 via the first driver 103.

During operation period 3, i.e., when the transistors 101 and 102 are simultaneously off, i.e., during a dead-time period, a charging path is formed from the input supply voltage VL application node via the bootstrap diode 105, the bootstrap capacitor 202, the inductor 203, and the smoothing capacitor 205. Thus, the charging path via the transistor 102 is cut off for a short period.

Figure 2:
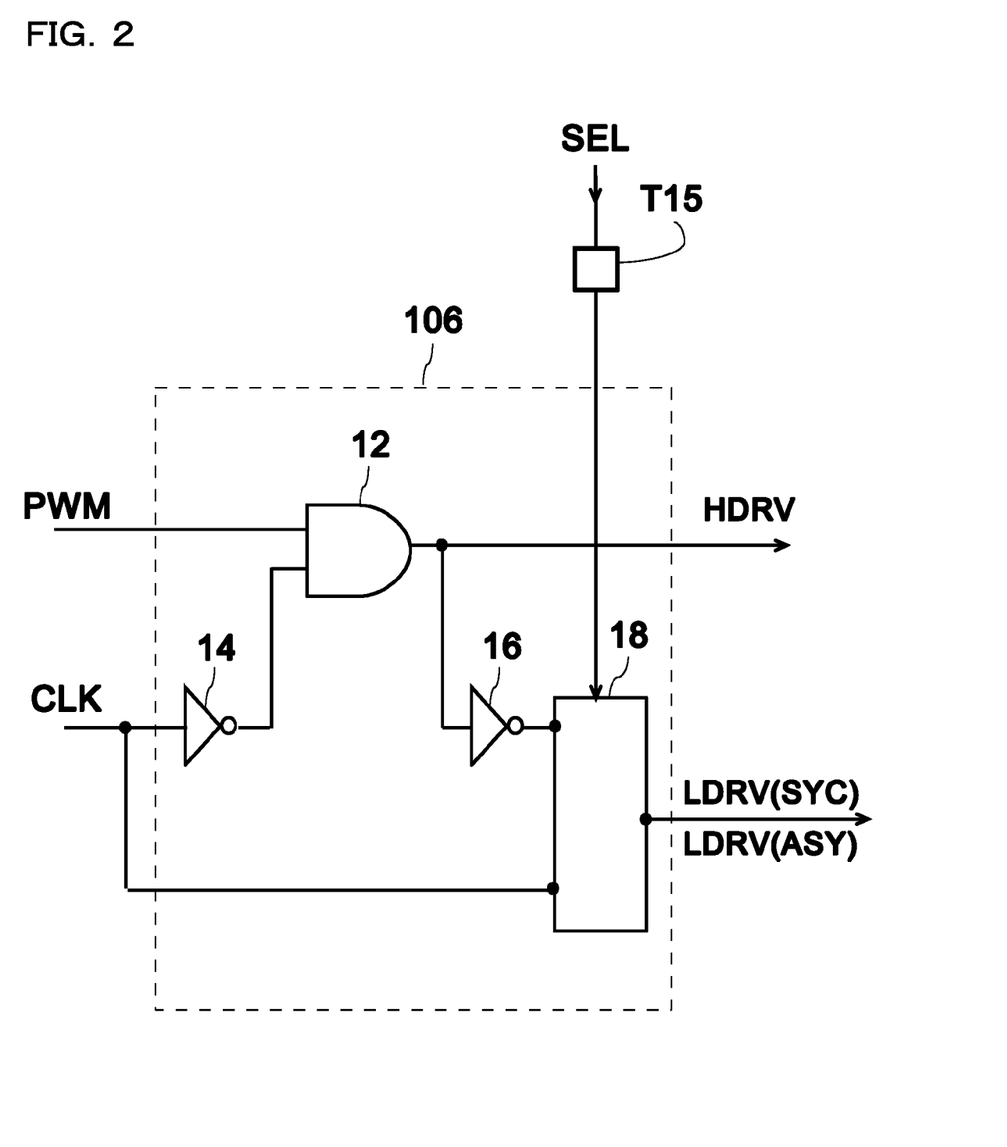
FIG. 2 is a diagram showing one configuration example of a drive logic circuit 106.

FIG. 2 is a diagram showing one configuration example of the drive logic circuit 106. The drive logic circuit 106 incorporates, in addition to the selecting means mentioned above, a dead time generation circuit, an interface circuit for interfacing between the overcurrent protection circuit 107 and the first driver 103, an interface circuit for interfacing between the overcurrent protection circuit 107 and the second driver 104, etc., though none of these is illustrated. The dead time generation circuit is a circuit which produces a period in which the first drive signal HDRV, the second drive signal LDRV(SYN), and the third drive signal LDRV (ASY) are simultaneously at low level to prevent the transistors 101 and 102 from turning on simultaneously.

An inverter 14 logically inverts the clock signal CLK and outputs the result to an AND (logical multiplication) circuit 12.

The AND circuit 12 performs AND operation between the pulse width modulation signal PWM and the output signal of the inverter 14, and outputs the result of the AND operation as the first drive signal HDRV. The first drive signal HDRV drives the transistor 101 via the first driver 103. The first drive signal HDRV is a so-called PWM signal of which the pulse width is kept modulated constantly irrespective of the level of the selection signal SEL applied to the external terminal T15, i.e., irrespective of whether synchronous or asynchronous rectification is selected.

An inverter 16 inverts the polarity of the first drive signal HDRV output from the AND circuit 12 and outputs the result as the second drive signal LDRV(SYN) to a switch 18. The switch 18 can be a well-known switch of a twofold choice (either-or) type, and can be formed using a MOSFET or a bipolar transistor.

When the selection signal SEL is, for example, at low level, i.e., when synchronous rectification is selected, the switch 18 outputs the output signal of the inverter 16 as the second drive signal LDRV(SYN). By contrast, when the selection signal SEL is, for example, at high level, i.e., when asynchronous rectification is selected, the switch 18 outputs the third drive signal LDRV(ASY), which is substantially equivalent to the clock signal CLK. The switch 18 can be a simple switch of a twofold choice type, but may instead be a switch of a threefold choice (one-of-three) type, in which case the third alternative involves, for example, applying a signal that is at low level or at high level all the time to the second driver so as to completely shut down the operation of the transistor 102 serving for synchronous rectification. This makes it possible to apply the present invention even to step-down and step-up DC-DC converters inherently adopting asynchronous rectification.

Figure 3:
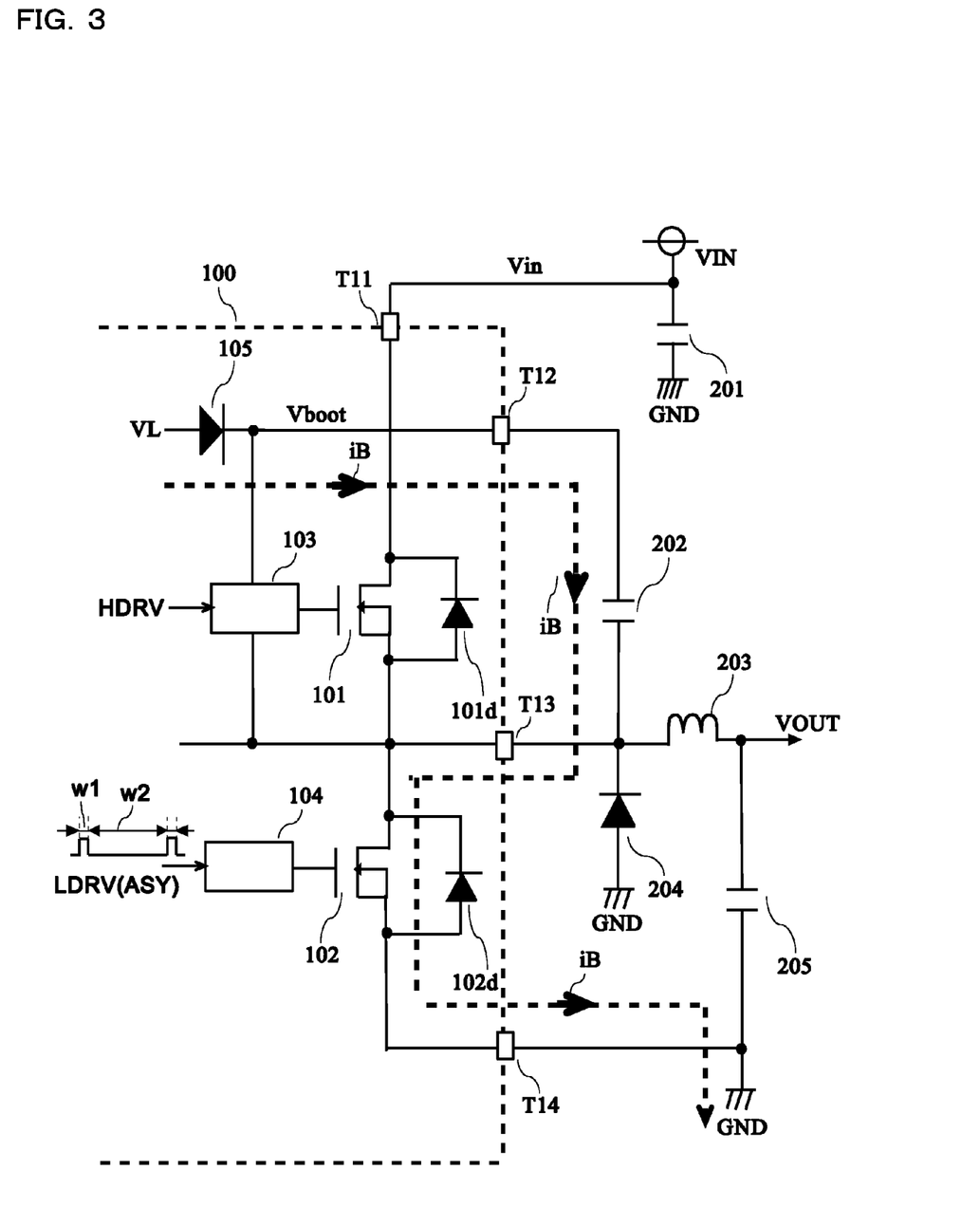
FIG. 3 is a diagram showing circuit operation of the DC-DC converter of the configuration example shown in FIG. 1 when operated in asynchronous rectification.

FIG. 3 is a circuit diagram in illustration of the operation of a bootstrap circuit when a DC-DC converter according to the present invention is used in asynchronous rectification. The semiconductor integrated circuit device 100 incorporates other circuits and components as shown in FIG. 1 in reality, but these are here omitted from illustration for convenience' sake. Those parts which are shown also in FIG. 1 are identified by common reference signs, and no overlapping description will be repeated.

In the semiconductor integrated circuit device 100 shown in FIG. 3, when it engages in asynchronous rectification, the rectification diode 204 is connected to the external terminal T13. Inherently, asynchronous rectification does not require the transistor 102, but in the present invention, the transistor 102 is exploited effectively. In asynchronous rectification, the third drive signal LDRV(ASY), which is substantially equivalent to the clock signal CLK, is fed to the gate of the transistor 102. Like the clock signal CLK, the third drive signal LDRV(ASY) has a first pulse width w1 and a second pulse width w2; during the period of the first pulse width w1, the transistor 102 is on, and during the period of the second pulse width w2, the transistor 102 is off. In the present specification, the proportion of the first and second pulse widths w1 and w2 is defined by an on-duty ratio Do (=w1/(w1+w2)). It is preferable that the on-duty ratio Do be in the range of 0.02 to 0.30. This is because, in asynchronous rectification, no operation complementary with the transistor 101 is necessary, and it suffices to form a charging path through which the bootstrap capacitor 202 can be charged from the input supply voltage VL via the bootstrap diode 105. With the on-duty ratio Do under 0.02, the bootstrap capacitor 202 cannot be charged sufficiently, inconveniently making it impossible to obtain the desired effect of stepping-up. On the other hand, with the on-duty ratio Do over 0.30, the bootstrap circuit has a sufficient charging effect, but the transistor 102 consumes more electric power, diminishing the benefit of adopting asynchronous rectification.

The charging path iB in the bootstrap circuit runs from the input supply voltage VL to the external terminal T12, to the bootstrap capacitor 202, to the external terminal T13, to the transistor 102, and to the external terminal T14 (GND).

As mentioned above, it is preferable that the on-duty ratio Do with which the transistor 102 is turned on be in the range Do=0.02 to 0.30. The on-duty ratio Do can be set with consideration given to the frequency of the clock signal CLK. This is because, the higher the frequency of the clock signal CLK is, naturally the shorter the first and second pulse widths w1 and w2 are. For example, if the clock signal CLK is 1 MHz and the on-duty ratio Do is, for discussion's sake, 0.1, then the first pulse width w1=0.1 μs and the second pulse width w2=0.9 μs. When the clock signal CLK has a frequency of, for discussion's sake, 3 MHz, the first pulse width w1=0.033 μs and the second pulse width w2=0.297 μs. Thus, when the clock signal CLK has a frequency of 3 MHz, compared with when the clock signal CLK has a frequency of 1 MHz, the first pulse width w1 is one-third as large, and the charging time for charging the bootstrap capacitor 202 is one-third as long. This may inconveniently result in an insufficient voltage obtained at the external terminal T12. In that case, the first pulse width w1 can be set with consideration given to the capacitance of the bootstrap capacitor 202 and the switching characteristics and on-state resistance of the transistor 102.

When the clock signal CLK has a frequency of 200 kHz, the first pulse width w1=0.5 μs and the second pulse width w2=4.5 μs. Thus, when the clock signal CLK has a frequency of 200 kHz, compared with when the clock signal CLK has a frequency of 3 MHz, the first pulse width w1 is 15 times as large. In general, the longer the charging time of the bootstrap capacitor 202 is, the larger the effect of stepping-up is. Accordingly, setting the on-duty ratio Do=w1/(w1+w2)=0.30 when the clock signal CLK has a frequency of 3 MHz, and setting the on-duty ratio Do=w1/(w1+w2)=0.02 when the clock signal CLK has a frequency of 200 kHz, result in a substantially equal charging time.

Figure 4:
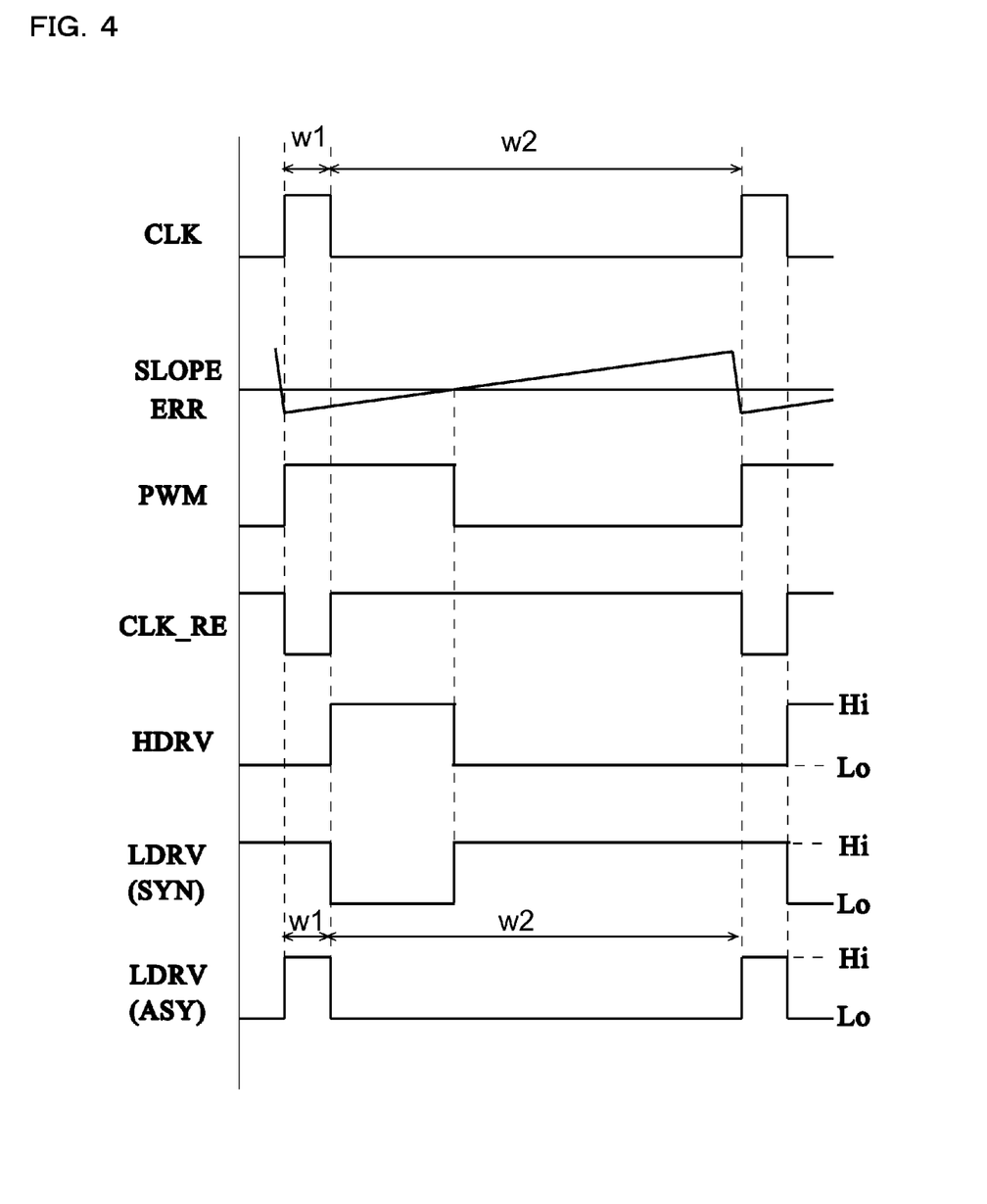
FIG. 4 is a timing chart showing one example of a drive control sequence.

FIG. 4 is a timing chart showing one example of a driving method control sequence at start-up. FIG. 4 shows, in the first row, the clock signal CLK. The clock signal CLK has a frequency, for example, in the range of 200 kHz to 3 MHz. The clock signal CLK has a first pulse width w1 and a second pulse width w2. In the present specification, the proportion of the first and second pulse widths w1 and w2 is, as mentioned previously, defined by the on-duty ratio Do (=w1/(w1+w2)). The on-duty ratio Do is in the range of 0.02 to 0.30. The clock signal CLK serves as a reference signal based on which the slope voltage generation circuit 108 generates the slope voltage SLOPE, and is used as the third drive signal for driving the transistor 102 when asynchronous rectification is adopted.

FIG. 4 shows, in the second row, the slope voltage SLOPE generated by the slope voltage generation circuit 108 and the error voltage VERR output from the error amplifier 110. The slope voltage SLOPE is generated by charging and discharging a capacitor, for example, with a constant current in synchronism with the clock signal CLK. The slope voltage SLOPE serves as a reference signal for outputting a so-called PWM signal of which the pulse width is modulated in the PWM comparator 109. The error voltage VERR is output from the error amplifier 110. The error voltage VERR is a signal representing the result of comparison between the reference voltage VREF generated in the reference voltage generation circuit 111 and a feedback voltage VFB.

FIG. 4 shows, in the third row, the pulse width modulation signal PWM output from the PWM comparator 109. The pulse width modulation signal PWM is a signal representing the result of comparison between the slope voltage SLOPE and the error voltage VERR shown in the second row.

FIG. 4 shows, in the fourth row, a signal CLK_RE, which is a signal obtained by inverting the polarity of the clock signal CLK shown in the first row.

FIG. 4 shows, in the fifth row, the first drive signal HDRV which is output from the drive logic circuit 106 and which drives the transistor 101. The first drive signal HDRV is a signal obtained by performing AND operation (logical multiplication) between the pulse width modulation signal PWM shown in the third row and the clock signal CLK_RE shown in the fourth row. The first drive signal HDRV is output from the AND circuit 12 shown in FIG. 2. The first drive signal HDRV remains the same all the time irrespective of whether synchronous or asynchronous rectification is selected, i.e., irrespective of whether the external terminal T15 is at low level or at high level.

FIG. 4 shows, in the sixth row, the second drive signal LDRV(SYN) which is output from the drive logic circuit 106 when synchronous rectification is selected, i.e., when the external terminal T15 is at low level, in order to drive the transistor 102 via the second driver 104. The second drive signal LDRV(SYN) has an inverted polarity compared with, i.e., in a so-called complementary relationship with, the first drive signal HDRV shown in the fifth row. As a result of the second drive signal LDRV(SYN) being in a complementary relationship with the first drive signal HDRV, when the transistor 102 is on, the transistor 101 is off; when the transistor 102 is off, the transistor 101 is on; thus the two transistors stably feed electric current to the inductor 203. As mentioned previously, a dead time is provided in which the two transistors are simultaneously off.

FIG. 4 shows, in the last row, the third drive signal LDRV(ASY) which is output from the drive logic circuit 106 when asynchronous rectification is selected, i.e., when the external terminal T15 is at high level, in order to drive the transistor 102 via the second driver 104. The third drive signal LDRV(ASY) is substantially equivalent to the clock signal CLK shown in the first row. The third drive signal LDRV(ASY) has its signal polarity and level shift timing so set as to remain at low level throughout when the first drive signal HDRV shown in the fifth row is at high level Hi, and to be turned to high level Hi for a part of the period in which the first drive signal HDRV is at low level. Thus, even when asynchronous rectification is selected, the transistor 102 turns on for a period substantially equivalent to the clock signal CLK, and forms the charging path iB shown in FIG. 3. Although the first drive signal HDRV in the fifth row is shown to turn from low level Lo to high level Hi immediately when the third drive signal LDRV(ASY) shown in the last row turns from high level Hi to low level Lo, in reality, a dead time is provided.

Figure 6:
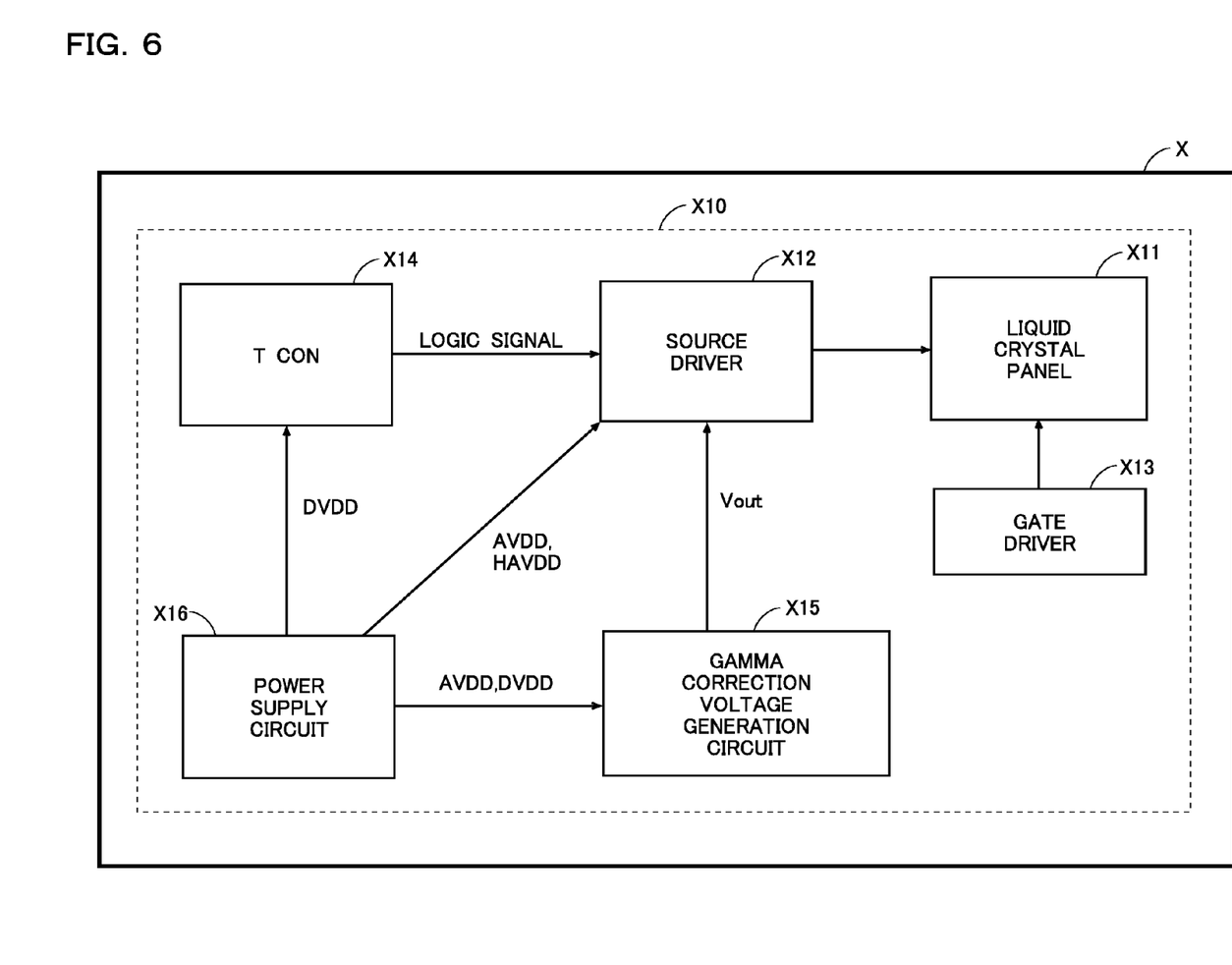
FIG. 6 is a block diagram of a television receiver incorporating a DC-DC converter.
Figure 7A:
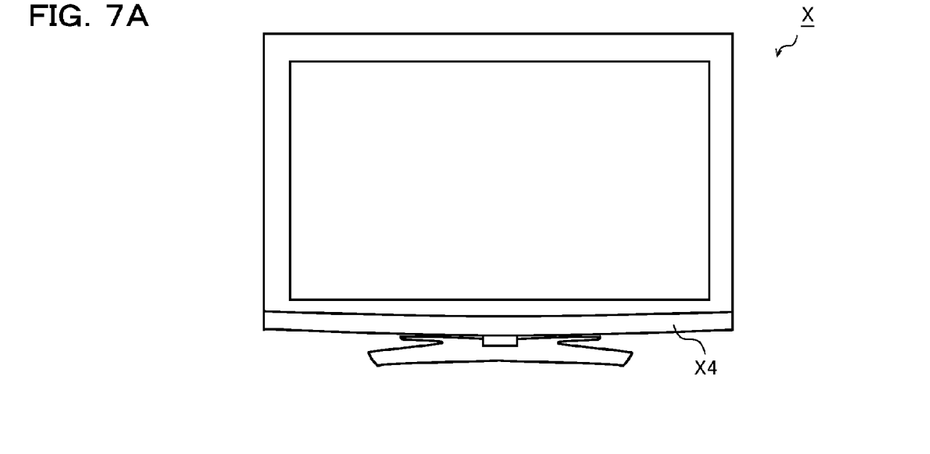
FIG. 7A is a front view of a television receiver incorporating a DC-DC converter.
Figure 7B:
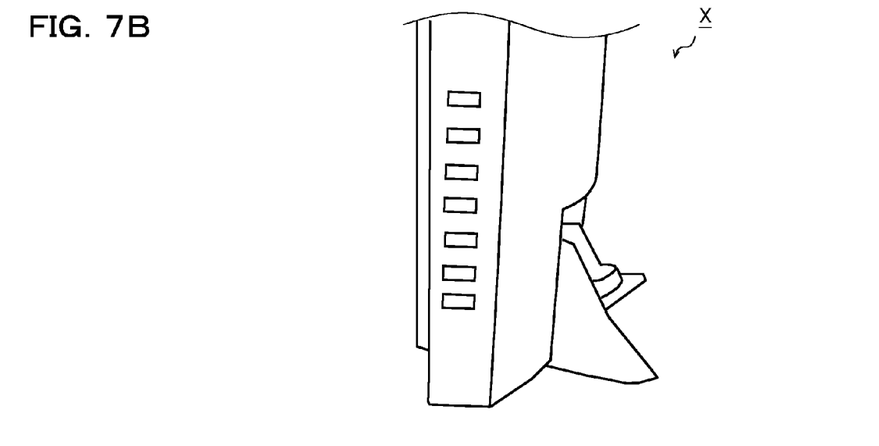
FIG. 7B is a side view of a television receiver incorporating a DC-DC converter.
Figure 7C:
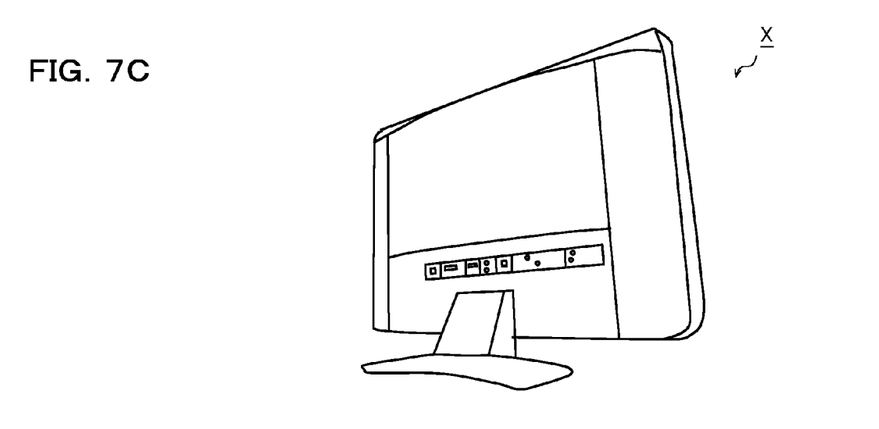
FIG. 7C is a rear view of a television receiver incorporating a DC-DC converter.

Application to a Television Receiver:

FIG. 6 is a block diagram showing one configuration example of a television receiver X incorporating a DC-DC converter. FIGS. 7A to 7C are a front view, a side view, and a rear view, respectively, of the television receiver X incorporating a DC-DC converter.

A display unit X10 includes a liquid crystal panel X11, a source driver X12, a gate driver X13, a timing controller (TCON) X14, a gamma correction voltage generation circuit X15, and a power supply circuit X16.

The liquid crystal panel X11 has a plurality of data lines and a plurality of scanning lines. At each of the intersections between the data lines and the scanning lines, a pixel circuit is provided. In response to a signal from the timing controller X14, the gate driver X13 selects one after another of the plurality of scanning lines.

The gamma correction voltage generation circuit X15 receives a supply voltage AVDD from the power supply circuit X16 and generates a gamma correction voltage Vout. The gamma correction voltage Vout is fed to the source driver X12.

The power supply circuit X16 generates positive supply voltages AVDD and DVDD and an intermediate voltage HAVDD. The intermediate voltage HAVDD is a voltage between the supply voltage AVDD and the ground voltage GND. The supply voltage AVDD is fed to the source driver X12 and to the gamma correction voltage generation circuit X15. The intermediate voltage HAVDD is fed to the source driver X12. The supply voltage DVDD is fed to the timing controller X14 and to the gamma correction voltage generation circuit X15.

The DC-DC converter described previously can be used as the power supply circuit X16. In particular, the DC output voltage Vout generated by the DC-DC converter can be suitably used as the supply voltage DVDD which is fed to the timing controller X14, etc.

The source driver X12 receives a logic signal from the timing controller X14. The logic signal is a signal for controlling the timing of image display by the liquid crystal panel X11. Also, the source driver X12 receives the gamma correction voltage Vout from the gamma correction voltage generation circuit X15 and generates a gradation voltage. Thus, the source driver X12 performs gamma correction for the liquid crystal panel X11. The source driver X12 drives the data lines according to the gradation signal and the logic signal from the inverter 14.

Advantageous Effects of the Invention:

A DC-DC converter provided with a bootstrap circuit according to the present invention allows easy selection of either synchronous or asynchronous rectification with a simple configuration, and can maintain desired voltage step-up operation because it can operate the bootstrap circuit even in asynchronous rectification.

INDUSTRIAL APPLICABILITY

As described above, a DC-DC converter according to the present invention allows comparatively easy selection of either synchronous or asynchronous rectification with a simple configuration, and can be started up reliably and quickly; it thus has high industrial applicability.

MODIFICATIONS

The present invention can be implemented in any other manners than specifically described above by way of embodiments, and allows for many modifications within the spirit of the invention. That is, the embodiments described above should be considered to be in every aspect simply illustrative and not restrictive, and it should be understood that the technical scope of the present invention is defined not by the description of embodiments given above but by the appended claims and encompasses any modifications in the sense and scope equivalent to those of the appended claims.

What is claimed is:

1. A DC-DC converter for converting a DC input voltage into a desired DC output voltage to output the DC output voltage, comprising:
   a high-side switching device connected to the DC input voltage and operable in synchronism with a clock signal;
   a first driver fed with a first drive signal stepped-up to or over the DC input voltage so as to be operable to drive the high-side switching device;
   a bootstrap circuit having a bootstrap capacitor so as to be operable to generate the first drive signal;
   a low-side switching device connected in series with the high-side switching device between the DC input voltage and a ground voltage, the low-side switching device being operable to be on during a period in which the high-side switching device is off;
   a second driver operable to drive the low-side switching device, the second driver being fed with a second drive signal which is complementary with the first drive signal; and
   a drive logic circuit operable to drive the first and second drivers,
   wherein
   the drive logic circuit includes a selector operable to select one of the second drive signal and a third drive signal, the third signal being for turning on the low-side switching device during a period which corresponds, not to entirety of, but to a part of the period in which the high-side switching device is off, wherein the one of the second drive signal and the third drive signal selected by the selector is fed to the second driver.

2. A DC-DC converter for converting a DC input voltage into a desired DC output voltage to output the DC output voltage, comprising:

a high-side switching device connected to the DC input voltage and operable in synchronism with a clock signal;

a first driver fed with a first drive signal stepped-up to or over the DC input voltage so as to be operable to drive the high-side switching device;

a bootstrap circuit having a bootstrap capacitor so as to be operable to generate the first drive signal;

a low-side switching device connected in series with the high-side switching device between the DC input voltage and a ground voltage, the low-side switching device being operable to be on when the high-side switching device is off;

a second driver operable to drive the low-side switching device, the second driver being fed with a second drive signal which is complementary with the first drive signal; and a drive logic circuit operable to drive the first and second drivers, wherein the drive logic circuit includes a selector operable to select and feed to the second driver either the second drive signal or a third drive signal equivalent to the clock signal, the clock signal has a first pulse width w1 and a second pulse width w2 forming a rectangular waveform, and the low-side switching device is turned on with an on-duty ratio Do (=w1/(w1+w2)) in a range of 0.02 to 0.30.

3. The DC-DC converter of claim 2, wherein when the selector selects the second drive signal, the DC-DC converter operates by synchronous rectification.

4. The DC-DC converter of claim 2, wherein when the selector selects the third drive signal, the DC-DC converter operates by asynchronous rectification in which a rectification diode is connected in parallel with the low-side switching device.

5. The DC-DC converter of claim 3, wherein the high-side switching device, the low-side switching device, the first driver, the second driver, and the drive logic circuit are incorporated into a semiconductor integrated circuit device having a plurality of external terminals, the selector in the drive logic circuit is provided with one of the external terminals, and that one of the external terminals which is provided in the selector is fed with a selection signal for selecting either the synchronous rectification and the asynchronous rectification.

6. The DC-DC converter of claim 5, further comprising:

a feedback voltage generator operable to divide the DC output voltage to generate a feedback voltage;

an error amplifier operable to amplify a difference between the feedback voltage and a reference voltage to generate an error voltage;

a slope voltage generation circuit operable to generate a triangular-wave voltage synchronous with the clock signal; and a PWM comparator operable to compare the error voltage with the triangular-wave voltage to generate a pulse width modulation signal having a modulated pulse width, wherein a first input terminal of the selector is fed with the pulse width modulation signal output from the PWM comparator, a second input terminal of the selector is fed with the clock signal, and either the second drive signal or the third drive signal is selected and fed from an output terminal of the selector to the second driver.

7. The DC-DC converter of claim 6, wherein the selector includes:

a circuit operable to perform AND operation between the pulse width modulation signal and the clock signal; and a switch operable to output either a signal resulting from the AND operation or the clock signal, wherein based on the selection signal fed to that one of the external terminals which is provided in the selector in the drive logic circuit, the switch feeds, from an output terminal thereof, either the second drive signal or the third drive signal to the second driver.

8. The DC-DC converter of claim 7, further comprising:

an overcurrent protection circuit, wherein when an electric current passing through the high-side switching device exceeds a predetermined reference value, the overcurrent protection circuit turns off the high-side switching device via the drive logic circuit.

9. The DC-DC converter of claim 4, wherein the high-side switching device, the low-side switching device, the first driver, the second driver, and the drive logic circuit are incorporated into a semiconductor integrated circuit device having a plurality of external terminals, the selector in the drive logic circuit is provided with one of the external terminals, and that one of the external terminals which is provided in the selector is fed with a selection signal for selecting either the synchronous rectification and the asynchronous rectification.

10. The DC-DC converter of claim 9, further comprising:

a feedback voltage generator operable to divide the DC output voltage to generate a feedback voltage;

an error amplifier operable to amplify a difference between the feedback voltage and a reference voltage to generate an error voltage;

a slope voltage generation circuit operable to generate a triangular-wave voltage synchronous with the clock signal; and a PWM comparator operable to compare the error voltage with the triangular-wave voltage to generate a pulse width modulation signal having a modulated pulse width, wherein a first input terminal of the selector is fed with the pulse width modulation signal output from the PWM comparator, a second input terminal of the selector is fed with the clock signal, and either the second drive signal or the third drive signal is selected and fed from an output terminal of the selector to the second driver.

11. The DC-DC converter of claim 10, wherein the selector includes:

a circuit operable to perform AND operation between the pulse width modulation signal and the clock signal; and a switch operable to output either a signal resulting from the AND operation or the clock signal, wherein based on the selection signal fed to that one of the external terminals which is provided in the selector in the drive logic circuit, the switch feeds, from an output terminal thereof, either the second drive signal or the third drive signal to the second driver.

12. The DC-DC converter of claim 11, further comprising:
an overcurrent protection circuit,
wherein when an electric current passing through the high-side switching device exceeds a predetermined reference value, the overcurrent protection circuit turns off the high-side switching device via the drive logic circuit.

13. A television receiver comprising:
a DC-DC converter for converting a DC input voltage into a desired DC output voltage to output the DC output voltage; and
a load fed with electric power from the DC-DC converter,
wherein the DC-DC comprises:
a high-side switching device connected to the DC input voltage and operable in synchronism with a clock signal;
a first driver fed with a first drive signal stepped-up to or over the DC input voltage so as to be operable to drive the high-side switching device;
a bootstrap circuit having a bootstrap capacitor so as to be operable to generate the first drive signal;
a low-side switching device connected in series with the high-side switching device between the DC input voltage and a ground voltage, the low-side switching device being operable to be on when the high-side switching device is off;
a second driver operable to drive the low-side switching device, the second driver being fed with a second drive signal which is complementary with the first drive signal; and
a drive logic circuit operable to drive the first and second drivers,
wherein the drive logic circuit includes a selector operable to select and feed to the second driver either the second drive signal or a third drive signal equivalent to the clock signal.

14. The television receiver of claim 13, wherein the load is a timing controller.

15. The DC-DC converter of claim 1, wherein the high-side switching device includes an N channel transistor.

16. The DC-DC converter of claim 1, wherein
when the selector selects the second drive signal, the DC-DC converter operates by synchronous rectification, and when the selector selects the third drive signal, the DC-DC converter operates by asynchronous rectification in which a rectification diode is connected in parallel with the low-side switching device.

17. The DC-DC converter of claim 1, wherein when the selector selects the second drive signal, the DC-DC converter operates by synchronous rectification, and when the selector selects the third drive signal, the DC-DC converter operates by asynchronous rectification.

18. The DC-DC converter of claim 17, wherein
the high-side switching device, the low-side switching device, the first driver, the second driver, and the drive logic circuit are incorporated into a semiconductor integrated circuit device having a plurality of external terminals,
the selector in the drive logic circuit is provided with one of the external terminals, and
that one of the external terminals which is provided in the selector is fed with a selection signal for selecting either the synchronous rectification and the asynchronous rectification.

* * * * *